(12) United States Patent
Mannebach et al.

(10) Patent No.: US 11,798,838 B2
(45) Date of Patent: Oct. 24, 2023

(54) CAPACITANCE REDUCTION FOR SEMICONDUCTOR DEVICES BASED ON WAFER BONDING

(71) Applicant: Intel Corporation, Santa Clara, CA (US)

(72) Inventors: Ehren Mannebach, Beaverton, OR (US); Aaron Lilak, Beaverton, OR (US); Rishabh Mehandru, Portland, OR (US); Hui Jae Yoo, Portland, OR (US); Patrick Morrow, Portland, OR (US); Kevin Lin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1069 days.

(21) Appl. No.: 16/358,520

(22) Filed: Mar. 19, 2019

(65) Prior Publication Data

US 2020/0303238 A1  Sep. 24, 2020

(51) Int. Cl.
*H01L 21/768* (2006.01)
*H01L 21/683* (2006.01)
(Continued)

(52) U.S. Cl.
CPC ...... *H01L 21/7682* (2013.01); *H01L 21/6836* (2013.01); *H01L 21/76256* (2013.01);
(Continued)

(58) Field of Classification Search
CPC ............. H01L 21/7682; H01L 21/6836; H01L 21/76256; H01L 21/76897; H01L 21/845;
(Continued)

(56) References Cited

U.S. PATENT DOCUMENTS 9,721,897 B1 * 8/2017 Cheng ................ H01L 29/6653
9,786,760 B1 10/2017 Bonilla
(Continued)

FOREIGN PATENT DOCUMENTS

EP      2814053    12/2014
GB      2495606    4/2013

OTHER PUBLICATIONS

Search Report from European Patent Application No. 20153079.7, dated Jul. 23, 2020, 8 pgs. 20153079.7.
(Continued)

*Primary Examiner* — Dale E Page
*Assistant Examiner* — Quovaunda Jefferson
(74) *Attorney, Agent, or Firm* — Schwabe, Williamson & Wyatt, P.C.

(57) ABSTRACT

Embodiments herein describe techniques for a semiconductor device including a carrier wafer, and an integrated circuit (IC) formed on a device wafer bonded to the carrier wafer. The IC includes a front end layer having one or more transistors at front end of the device wafer, and a back end layer having a metal interconnect coupled to the one or more transistors. One or more gaps may be formed by removing components of the one or more transistors. Furthermore, the IC includes a capping layer at backside of the device wafer next to the front end layer of the device wafer, filling at least partially the one or more gaps of the front end layer. Moreover, the IC includes one or more air gaps formed within the one or more gaps, and between the capping layer and the back end layer. Other embodiments may be described and/or claimed.

26 Claims, 12 Drawing Sheets

(51) Int. Cl.
*H01L 21/762* (2006.01)
*H01L 23/31* (2006.01)
*H01L 29/417* (2006.01)

(52) U.S. Cl.
CPC .... *H01L 23/3171* (2013.01); *H01L 29/41775* (2013.01); *H01L 2221/68381* (2013.01)

(58) Field of Classification Search
CPC ............. H01L 23/3171; H01L 23/5222; H01L 29/41775; H01L 2221/68381; H01L 27/1211
See application file for complete search history.

(56) References Cited

U.S. PATENT DOCUMENTS

| | | | |
|---|---|---|---|
| 9,812,555 B2* | 11/2017 | Madurawe | H01L 29/0649 |
| 10,529,826 B1* | 1/2020 | Frougier | H01L 29/42372 |
| 2010/0155932 A1 | 6/2010 | Gambino | |
| 2011/0309416 A1 | 12/2011 | Yamashita | |
| 2012/0199886 A1* | 8/2012 | Horak | H01L 21/76897 257/E21.409 |
| 2014/0070405 A1* | 3/2014 | Agarwal | H01L 23/3121 257/737 |
| 2016/0343638 A1* | 11/2016 | Bar | H01L 23/473 |
| 2018/0069092 A1 | 3/2018 | Samavedan | |
| 2018/0122800 A1 | 5/2018 | Cheng | |
| 2018/0138082 A1 | 5/2018 | Costa | |
| 2018/0233398 A1 | 8/2018 | Van Cleemput | |
| 2018/0331097 A1 | 11/2018 | Zang | |

OTHER PUBLICATIONS

Office Action from European Patent Application No. 20153079.7 dated Apr. 29, 2022, 8 pgs.

* cited by examiner

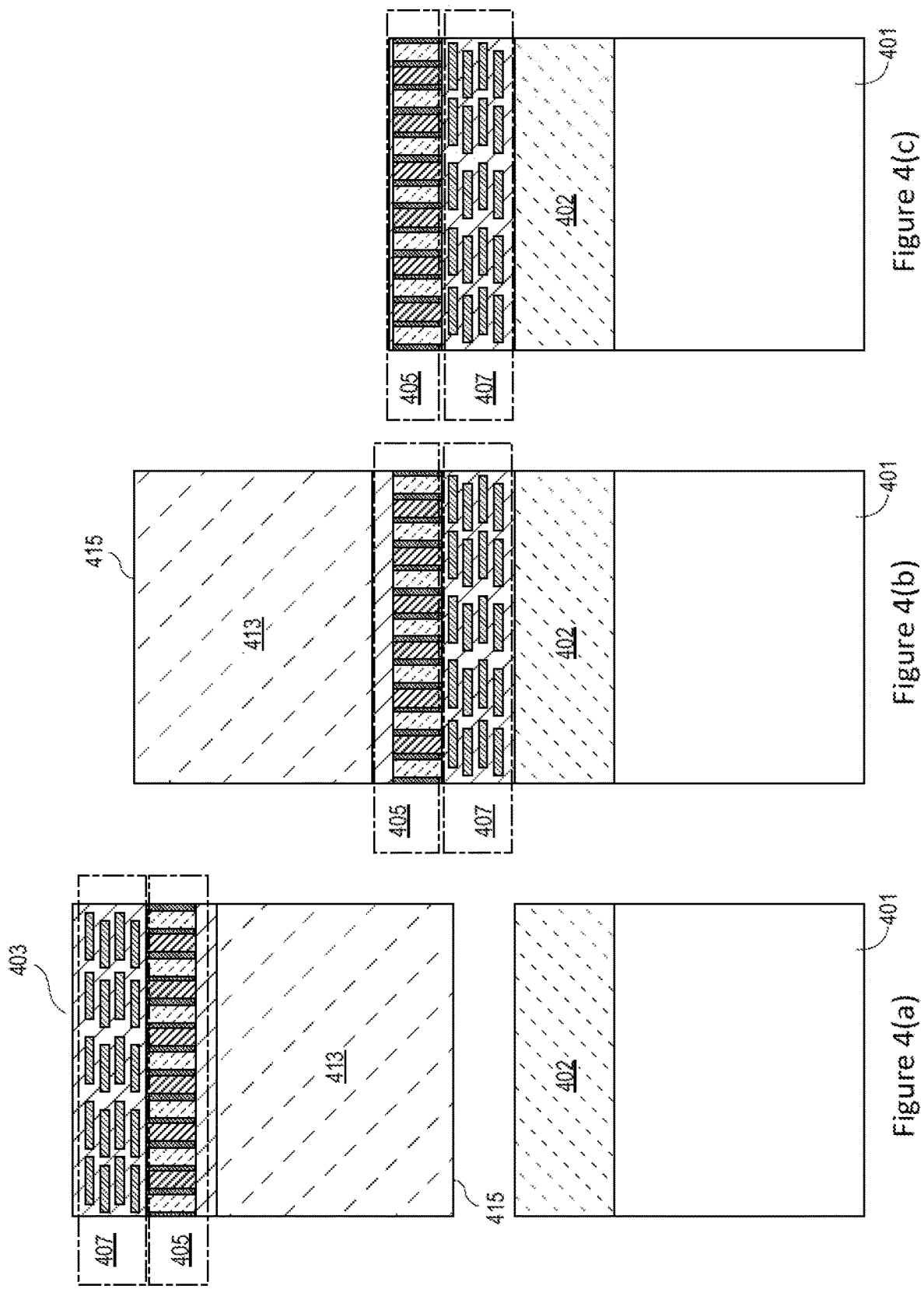

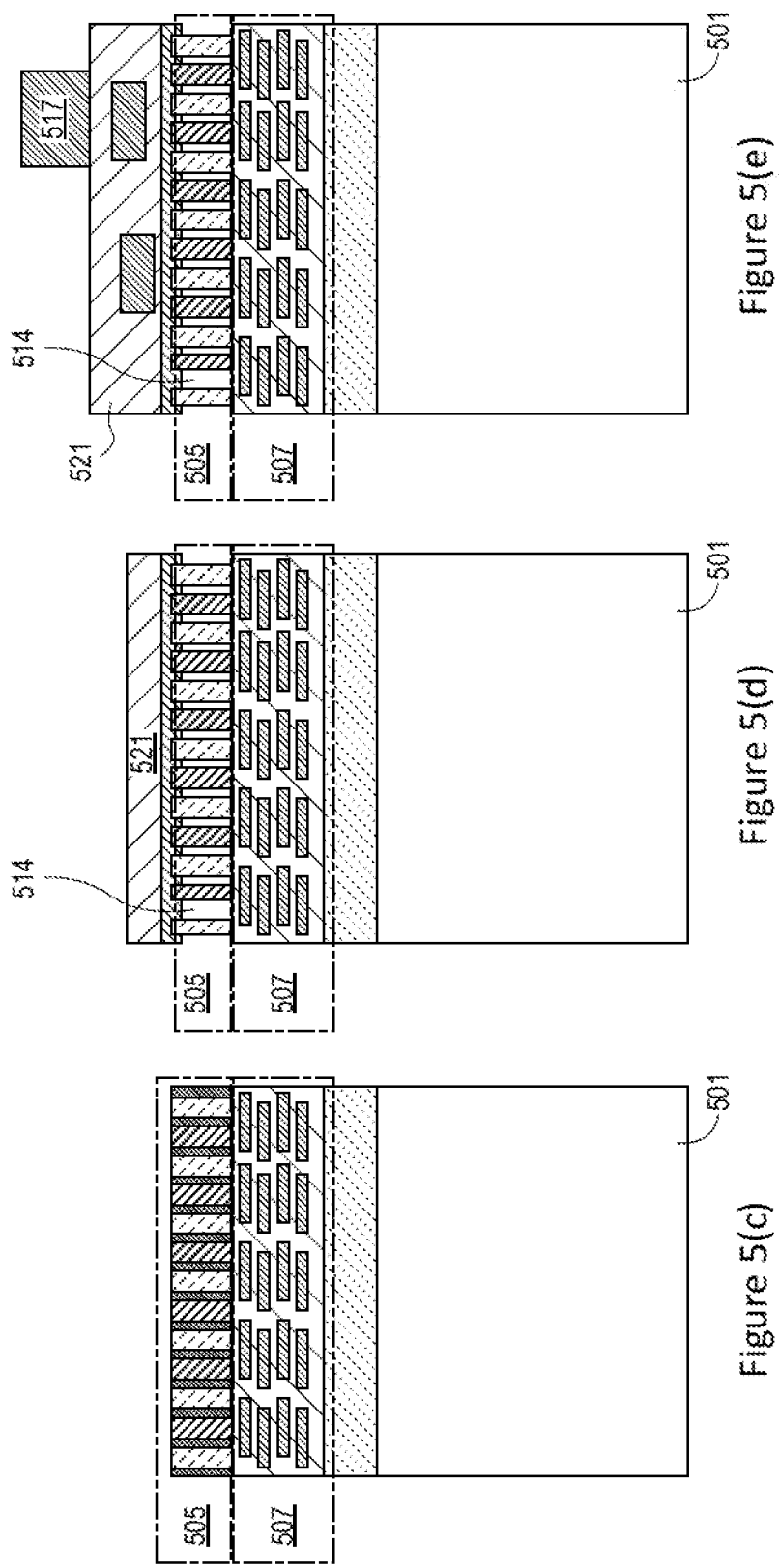

CAPACITANCE REDUCTION FOR SEMICONDUCTOR DEVICES BASED ON WAFER BONDING

FIELD

Embodiments of the present disclosure generally relate to the field of packaging, and more particularly, to capacitance reduction for semiconductor devices based on wafer bonding.

BACKGROUND

The manufacturing process for integrated circuits continues to improve in many ways, driven by the ongoing efforts to scale down the feature sizes of the individual circuit elements. Many techniques have been developed to reduce parasitic capacitance of semiconductor devices during the fabrication process to improve their performance. Wafer bonding is a packaging technology on wafer-level for microelectromechanical systems, nanoelectromechanical systems, microelectronics, or optoelectronics. Capacitance reduction techniques for semiconductor devices during the wafer bonding process may be desired to further improve the performance after the integrated circuits have been fabricated.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 4(a)-4(e) schematically illustrate a process for air gaps in semiconductor devices including a carrier wafer and an integrated circuit formed on a device wafer bonded to the carrier wafer, in accordance with some embodiments.

FIGS. 5(a)-5(e) schematically illustrate a process for air gaps in semiconductor devices including a carrier wafer and an integrated circuit formed on a device wafer bonded to the carrier wafer, in accordance with some embodiments.

DETAILED DESCRIPTION

Figure 1A:
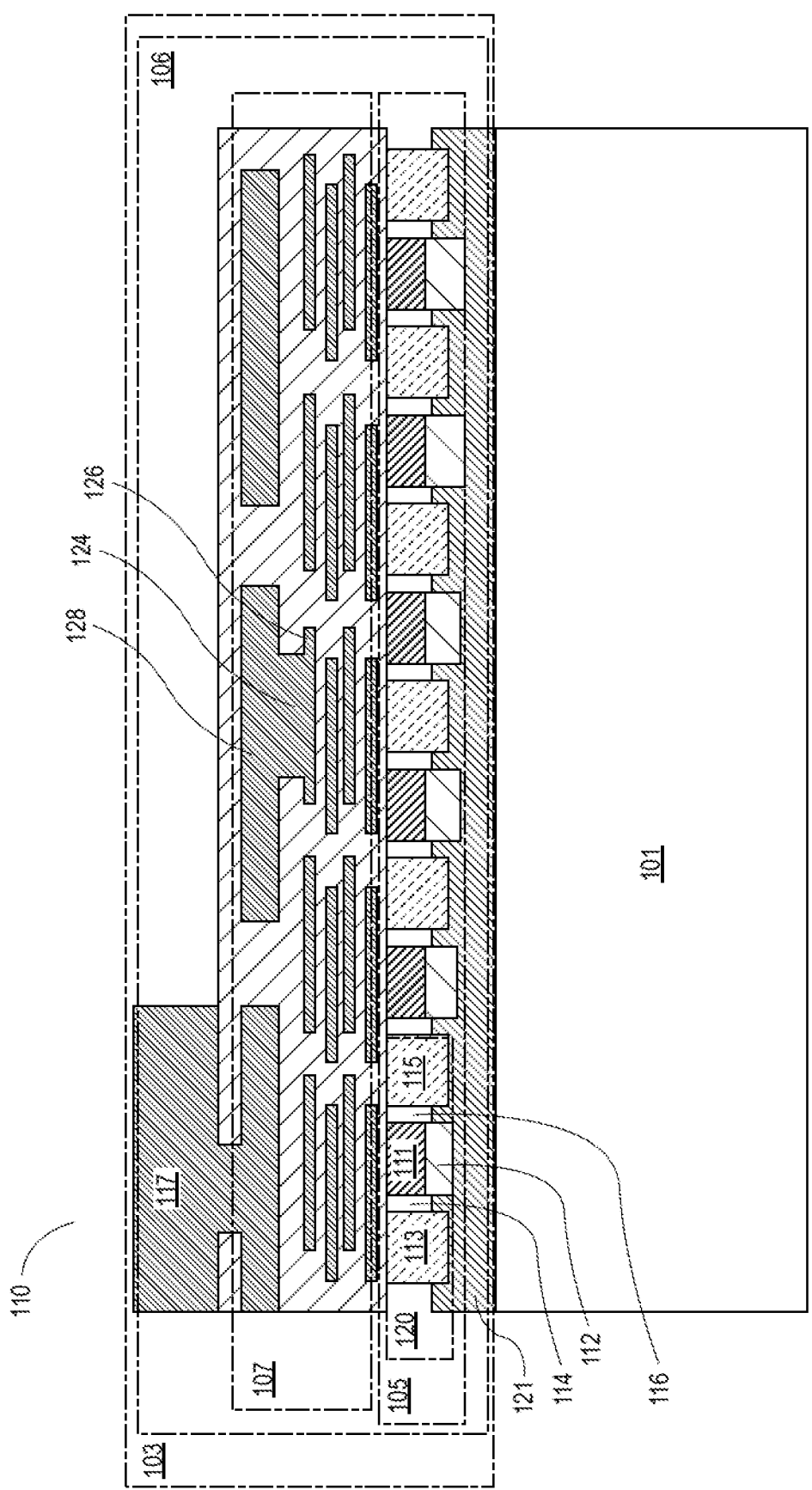
FIGS. 1(a)-1(d) schematically illustrate air gaps in semiconductor devices including a carrier wafer and an integrated circuit formed on a device wafer bonded to the carrier wafer, in accordance with some embodiments.

The manufacturing process for integrated circuits (IC) or devices may include many steps and operations performed on a device wafer. A device wafer may have a backside at the back of the substrate, and a front side opposite to the backside. Front-end-of-line (FEOL), or simply front end, semiconductor processing and structures may refer to a first portion of integrated circuit fabrication where individual devices (e.g., transistors, capacitors, resistors, etc.) are patterned in a semiconductor substrate or layer at the front side of the device wafer. FEOL generally covers everything up to (but not including) the deposition of metal interconnect layers. A transistor formed in FEOL may also be referred to as a front end transistor. Following the last FEOL operation, the result is typically a wafer with isolated transistors (e.g., without any wires). Back end of line (BEOL), or simply back end, semiconductor processing and structures may refer to a second portion of IC fabrication where the individual devices (e.g., transistors, capacitors, resistors, etc.) are interconnected with wiring on the wafer, e.g., the metallization layer or layers. BEOL includes a metal interconnect, e.g., metal contacts, vias, dielectrics layers, metal levels, and bonding sites for chip-to-package connections. For modern IC processes, more than 10 metal layers may be added in the BEOL. Many techniques have been developed to reduce parasitic capacitance of semiconductor during the front end or the back end of the fabrication process.

Wafer bonding is a packaging technology on wafer-level for microelectromechanical systems, nanoelectromechanical systems, microelectronics, or optoelectronics. After the IC or devices have been fabricated in a device wafer going through both the FEOL and BEOL at the front side, the device wafer may be bonded with a carrier wafer for further processing. Capacitance reduction techniques for semiconductor devices during the wafer bonding process or at the wafer bonding stage may be desired to improve further the performance of the semiconductor devices.

Embodiments herein may include methods and apparatus for capacitance reduction of a semiconductor device during the wafer bonding process after an IC has been fabricated on the device wafer. Components of one or more transistors of an IC may be selectively removed, to create low-k dielectric layers or air gaps. Embodiments herein may show air gaps as examples for reducing capacitance. The techniques and systems herein may equally applicable to create low-k dielectric layers and/or air gaps. The selective removing of components of transistors may be performed from the backside of the device wafer after the transistors and back end interconnects have been fully fabricated at the front side of the device wafer. In addition to removing components of transistors, interlayer dielectric material or other components, e.g., components of transistors at the BEOL, from back end interconnect layers (e.g. LI, M0, M1, etc.) may be similarly removed to form air gaps or low-k dielectric layers.

Embodiments herein may provide a semiconductor device including a carrier wafer, and an IC formed on a device wafer bonded to the carrier wafer. The IC includes a front end layer having one or more transistors at front end of the device wafer, and a back end layer having a metal interconnect coupled to the one or more transistors. One or more gaps may be formed by removing components of the one or more transistors. Furthermore, the IC includes a capping layer at backside of the device wafer next to the front end layer of the device wafer, filling at least partially the one or more gaps of the front end layer. Moreover, the IC includes one or more air gaps formed within the one or more gaps, and between the capping layer and the back end layer. The one or more air gaps are to reduce parasitic capacitance of the IC compared to the IC without the one or more air gaps.

Embodiments herein may present a method for forming a semiconductor device. The method includes forming an IC on a device wafer, where the IC includes a front end layer having one or more transistors at front end of the device wafer, and a back end layer having a metal interconnect coupled to the one or more transistors. The method also includes coupling the device wafer to a carrier wafer by coupling the back end layer of the device wafer to the carrier wafer; thinning the device wafer at backside of the device wafer to expose the one or more transistors; and removing one or more components of the one or more transistors to form one or more gaps at the front end layer. Furthermore, the method includes forming a capping layer at the backside of the device wafer to fill at least partially the one or more gaps at the front end layer. The capping layer is next to the front end layer of the device wafer, and one or more air gaps are formed within the one or more gaps, and between the capping layer and the back end layer.

Embodiments herein may present a computing device including a print circuit board (PCB), and a semiconductor device coupled to the PCB. The semiconductor device includes a carrier wafer, and an IC formed on a device wafer bonded to the carrier wafer. The IC includes a front end layer having one or more transistors at front end of the device wafer, and a back end layer having a metal interconnect coupled to the one or more transistors. One or more gaps may be formed by removing components of the one or more transistors. Furthermore, the IC includes a capping layer at backside of the device wafer next to the front end layer of the device wafer, filling at least partially the one or more gaps of the front end layer. Moreover, the IC includes one or more air gaps formed within the one or more gaps, and between the capping layer and the back end layer. The one or more air gaps are to reduce parasitic capacitance of the IC compared to the IC without the one or more air gaps.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. Circuitry may include one or more transistors. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
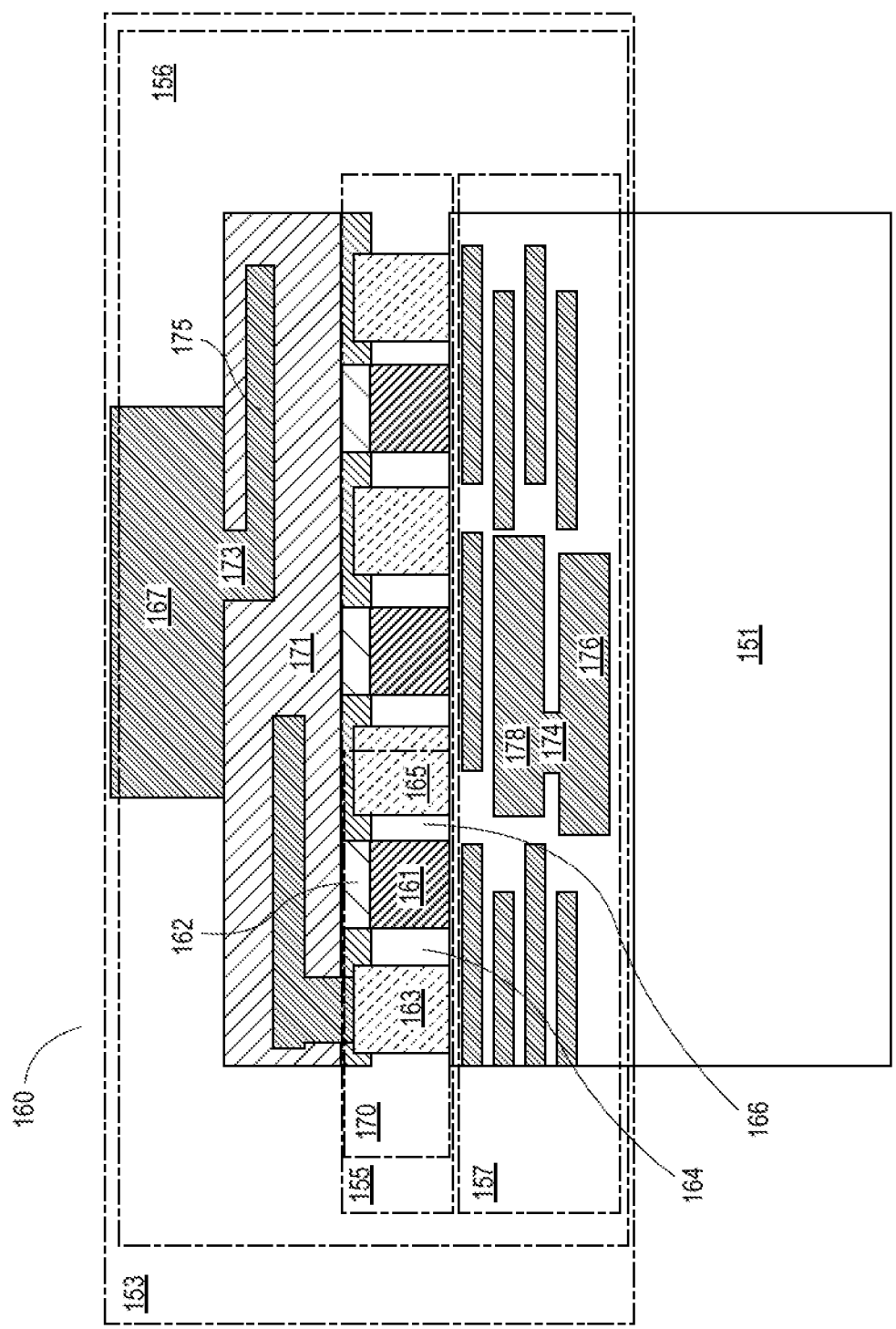

FIGS. 1(a)-1(d) schematically illustrate air gaps in semiconductor devices including a carrier wafer and an integrated circuit formed on a device wafer bonded to the carrier wafer. For example, as shown in FIG. 1(a), an air gap 114 or an air gap 116 are in a semiconductor device 110 including an integrated circuit 106 formed on a device wafer 103 bonded to a carrier wafer 101. As shown in FIG. 1(b), an air gap 164 or an air gap 166 are in a semiconductor device 160 including an integrated circuit 156 formed on a device wafer 153 bonded to a carrier wafer 151.

In embodiments, as shown in FIG. 1(a), the semiconductor device 110 includes the IC 106 formed on the device wafer 103 bonded to the carrier wafer 101. The device wafer 103 may be bonded to the carrier wafer 101 by direct bonding, surface activated bonding, adhesive bonding, reactive bonding, glass frit bonding, or hybrid bonding. The carrier wafer 101 may be a glass wafer, a sapphire wafer, a polymer wafer, a silicon wafer, or some other wafer.

In embodiments, the IC 106 includes a front end layer 105 and a back end layer 107, which are both at the front side of the device wafer 103. The front end layer 105 has one or more transistors, e.g., a transistor 120, at front end of the device wafer 103. The transistor 120 includes a channel 112, a gate electrode 111, a source electrode 113, and a drain electrode 115. The one or more transistors may include a nanowire transistor, a nanotube transistor, a nanoribbon transistor, a FinFET transistor, a tri-gate FinFET transistor, a multiple-gate field-effect transistor (MuGFET) transistor, or a gate-all-around FET transistor.

In embodiments, one or more gaps are formed by removing components of the one or more transistors, e.g., the transistor 120. For example, a gap may be formed between the gate electrode 111 and the source electrode 113, by removing at least a part of a spacer between the source electrode 113 and the gate electrode 111. Similarly, a gap may be formed between the gate electrode 111 and the drain electrode 115, by removing at least a part of a spacer between the drain electrode 115 and the gate electrode 111. The gap between the source electrode 113 and the gate electrode 111, or the gap between the drain electrode 115 and the gate electrode 111, may have a width in a range of about 1 nm to about 2 nm. When a gap is formed by removing a part of a spacer between the source electrode and the gate electrode, the transistor may still include a partial spacer between the source electrode and the gate electrode.

In embodiments, the back end layer 107 includes a metal interconnect coupled to the one or more transistors. The metal interconnect includes metal contacts in multiple metal layers, and vias coupling two metal contacts together, e.g., a metal contact 126, a metal contact 128, and a via 124. The IC 106 further includes power wires or bumps, e.g., a wire 117, coupled to the metal interconnect.

In embodiments, the IC 106 further includes a capping layer 121 at backside of the device wafer 103, next to the front end layer 105 of the device wafer 103, filling at least partially the one or more gaps of the front end layer 105. For example, the capping layer 121 fills partially a gap between the gate electrode 111 and the source electrode 113, or between the gate electrode 111 and the drain electrode 115. The capping layer 121 may include a low-k dielectric material with a dielectric constant in a range of about 1 to about 3. As shown in FIG. 1(a), the capping layer 121 is bonded to the carrier wafer 101.

Furthermore, one or more air gaps are formed within the one or more gaps, and between the capping layer 121 and the back end layer 107. For example, the air gap 114 is between the capping layer 121 and the back end layer 107 on the top and bottom sides, and also between the gate electrode 111 and the source electrode 113. The air gap 116 is between the capping layer 121 and the back end layer 107 on the top and bottom sides, and also between the gate electrode 111 and the drain electrode 115. The one or more air gaps are to reduce parasitic capacitance of the IC 106 compared to the IC 106 without the one or more air gaps. The lower dielectric constant of air also allows for smaller gaps between the gate electrode and source electrode or drain electrode. For example, a gap between the gate electrode and source electrode may be reduced from about 7 nm to about 2 nm. The saved space of the gap may be used to increase the contact surface area in source electrode or drain electrode, to scale the gate pitch (e.g. reduce about 45 nm pitch to about 35 nm pitch), or any combination thereof.

In embodiments, as shown in FIG. 1(b), the semiconductor device 160 includes the IC 156 formed on the device wafer 153 bonded to the carrier wafer 151. The IC 156 includes a front end layer 155 and a back end layer 157, which are both at the front side of the device wafer 153. The front end layer 155 has one or more transistors, e.g., a transistor 170, at front end of the device wafer 153. The transistor 170 includes a channel 162, a gate electrode 161, a source electrode 163, and a drain electrode 165.

In embodiments, one or more gaps are formed by removing components of the one or more transistors, e.g., the transistor 170. For example, a gap may be formed between the gate electrode 161 and the source electrode 163, by removing at least a part of a spacer between the source electrode 163 and the gate electrode 161. Similarly, a gap may be formed between the gate electrode 161 and the drain electrode 165, by removing at least a part of a spacer between the drain electrode 165 and the gate electrode 161.

In embodiments, the back end layer 157 includes a metal interconnect coupled to the one or more transistors. The metal interconnect includes metal contacts in multiple metal layers, and vias coupling two metal contacts together, e.g., a metal contact 176, a metal contact 178, and a via 174. The back end layer 157 is bonded to the carrier wafer 151.

In embodiments, the IC 156 further includes a capping layer 171 at backside of the device wafer 153, next to the front end layer 155 of the device wafer 153, filling at least partially the one or more gaps of the front end layer 155. For example, the capping layer 171 fills at least partially a gap between the gate electrode 161 and the source electrode 163, or between the gate electrode 161 and the drain electrode 165. In embodiments, the IC 156 further includes a second metal interconnect within the capping layer 171 at the backside of the device wafer. The second metal interconnect includes metal contacts in multiple metal layers, and vias coupling two metal contacts together, e.g., a metal contact 175, and a via 173. The IC 156 further includes power wires or bumps, e.g., a wire 167, coupled to the second metal interconnect within the capping layer 171.

Furthermore, one or more air gaps are formed within the one or more gaps, and between the capping layer 171 and the back end layer 157. For example, the air gap 164 is between the capping layer 171 and the back end layer 157 on the top and bottom sides, and also between the gate electrode 161 and the source electrode 163. The air gap 166 is between the capping layer 171 and the back end layer 157 on the top and bottom sides, and also between the gate electrode 161 and the drain electrode 165. The one or more air gaps are to reduce parasitic capacitance of the IC 156 compared to the IC 156 without the one or more air gaps.

Figure 1C:
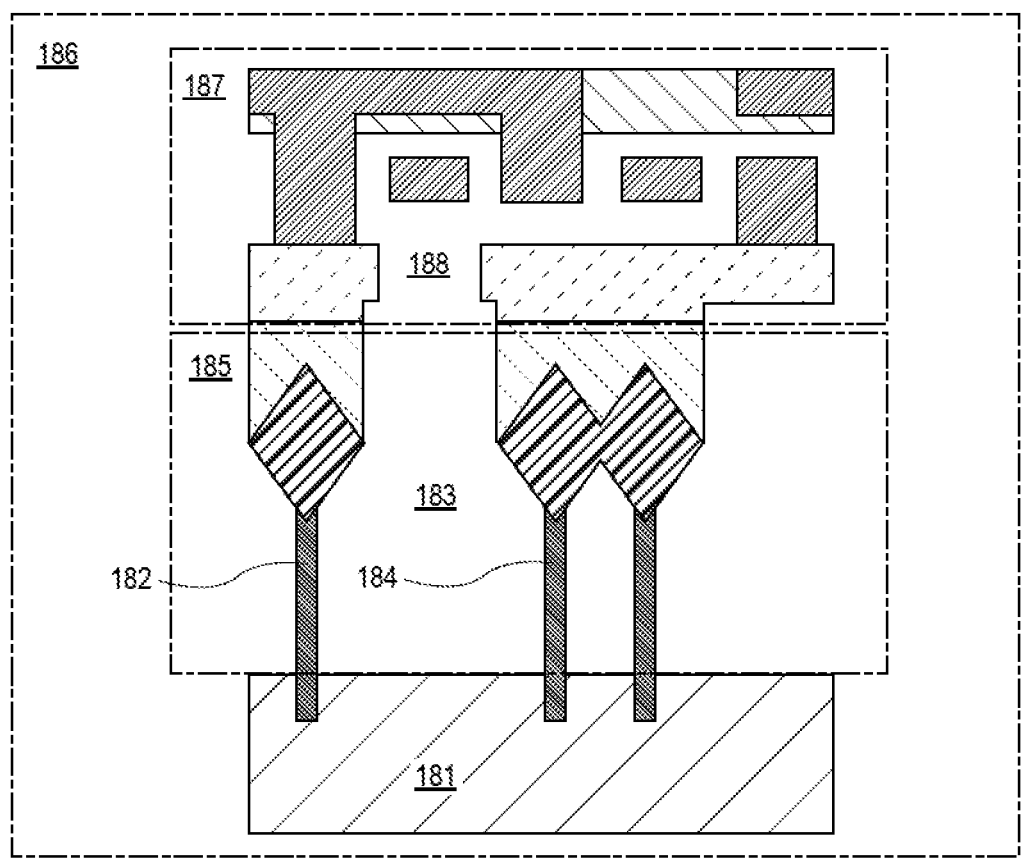
Figure 1D:
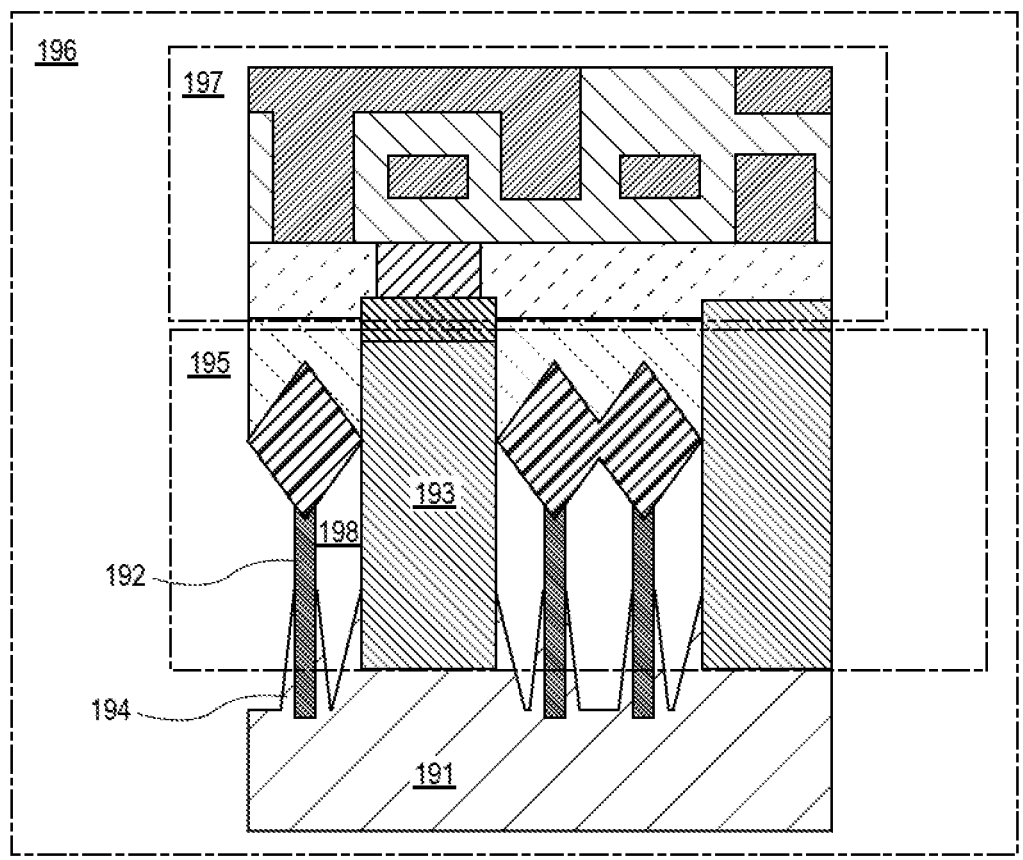

There may be more embodiments, e.g., as shown in FIGS. 1(c)-1(d), to implement air gaps or create low-k dielectric layers in semiconductor devices including an IC formed on a device wafer bonded to a carrier wafer. For simplicity, only part of the IC formed on a device wafer is shown in FIGS. 1(c)-1(d). The IC is formed on a device wafer, which is bonded to a carrier wafer.

In embodiments, as shown in FIG. 1(c), an IC 186 includes a front end layer 185 and a back end layer 187, which are both at the front side of the device wafer. The front end layer 185 has one or more transistors that may include one or more fins, nanowires, or other channel structures, e.g., a fin 182, a fin 184. The back end layer 187 includes a metal interconnect coupled to the one or more transistors. The metal interconnect includes metal contacts in multiple metal layers, and vias coupling two metal contacts together. Components, e.g., dielectric materials, at the front end layer 185 or the back end layer 187 may be removed to form gaps within the front end layer 185 or the back end layer 187, e.g., a gap 183 or a gap 188. For example, gaps may be formed by removing at least a part of a subfin dielectric layer around a fin of a transistor, an isolation wall of the front end layer between the one or more transistors, or a part of an inter-layer dielectric layer of the metal interconnect.

In embodiments, the IC 186 further includes a capping layer 181 at backside of the device wafer, next to the front end layer 185, filling at least partially the one or more gaps of the front end layer 185 or the back end layer 187. One or more air gaps are formed within the one or more gaps, and between the capping layer 181 and the back end layer 187. For example, an air gap is formed by the gap 183 between the capping layer 181 and the back end layer 187 on the top and bottom side. Similarly, an air gap is formed by the gap 188 between the capping layer 181 and the back end layer 187 on the top and bottom side. In general, air gaps are formed by air within a gap formed by removing at least a part of a subfin dielectric layer around a fin of a transistor, an isolation wall of the front end layer between the one or more transistors, or a part of an inter-layer dielectric layer of the metal interconnect.

The IC 186 is formed on a device wafer, which is bonded to a carrier wafer. The device wafer may be bonded to the carrier wafer by bonding the capping layer 181 to the carrier wafer, or by bonding the back end layer 187 to the carrier wafer.

In embodiments, as shown in FIG. 1(d), an IC 196 includes a front end layer 195 and a back end layer 197, which are both at the front side of a device wafer. The front end layer 195 has one or more transistors that may include one or more fins, nanowires, or other channel structures, e.g., a fin 192. The back end layer 197 includes a metal interconnect coupled to the one or more transistors. The metal interconnect includes metal contacts in multiple metal layers, and vias coupling two metal contacts together. Components, e.g., dielectric materials, at the front end layer 195 or the back end layer 197 may be removed to form gaps within the front end layer 195 or the back end layer 197. For example, gaps may be formed by removing at least a part of a subfin dielectric layer around a fin of a transistor, an isolation wall of the front end layer between the one or more transistors, or a part of an inter-layer dielectric layer of the metal interconnect.

In embodiments, the IC 196 further includes a capping layer 191 at backside of the device wafer, next to the front end layer 195, filling at least partially the one or more gaps of the front end layer 195 or the back end layer 197. When the capping layer 191 is being formed to fill the gaps, some capping layer material may accumulate around the fin 192, and form a partial coverage 194 of the fin 192. One or more air gaps are formed within the one or more gaps, and between the capping layer 191 and the back end layer 197. For example, an air gap 198 is formed by the gap between the capping layer 191 and the back end layer 197 on the top and bottom side. In general, air gaps are formed by air within a gap formed by removing at least a part of a subfin dielectric layer around a fin of a transistor, an isolation wall of the front end layer between the one or more transistors, or a part of an inter-layer dielectric layer of the metal interconnect. In addition, the IC 196 includes a low-k dielectric material 193 within the one or more gaps formed by removing components of the one or more transistors. In some embodiments, the low-k dielectric material has a dielectric constant in a range of about 1 to about 3.

The IC 196 is formed on the device wafer, which is bonded to a carrier wafer. The device wafer may be bonded to the carrier wafer by bonding the capping layer 191 to the carrier wafer, or by bonding the back end layer 197 to the carrier wafer.

Figure 2:
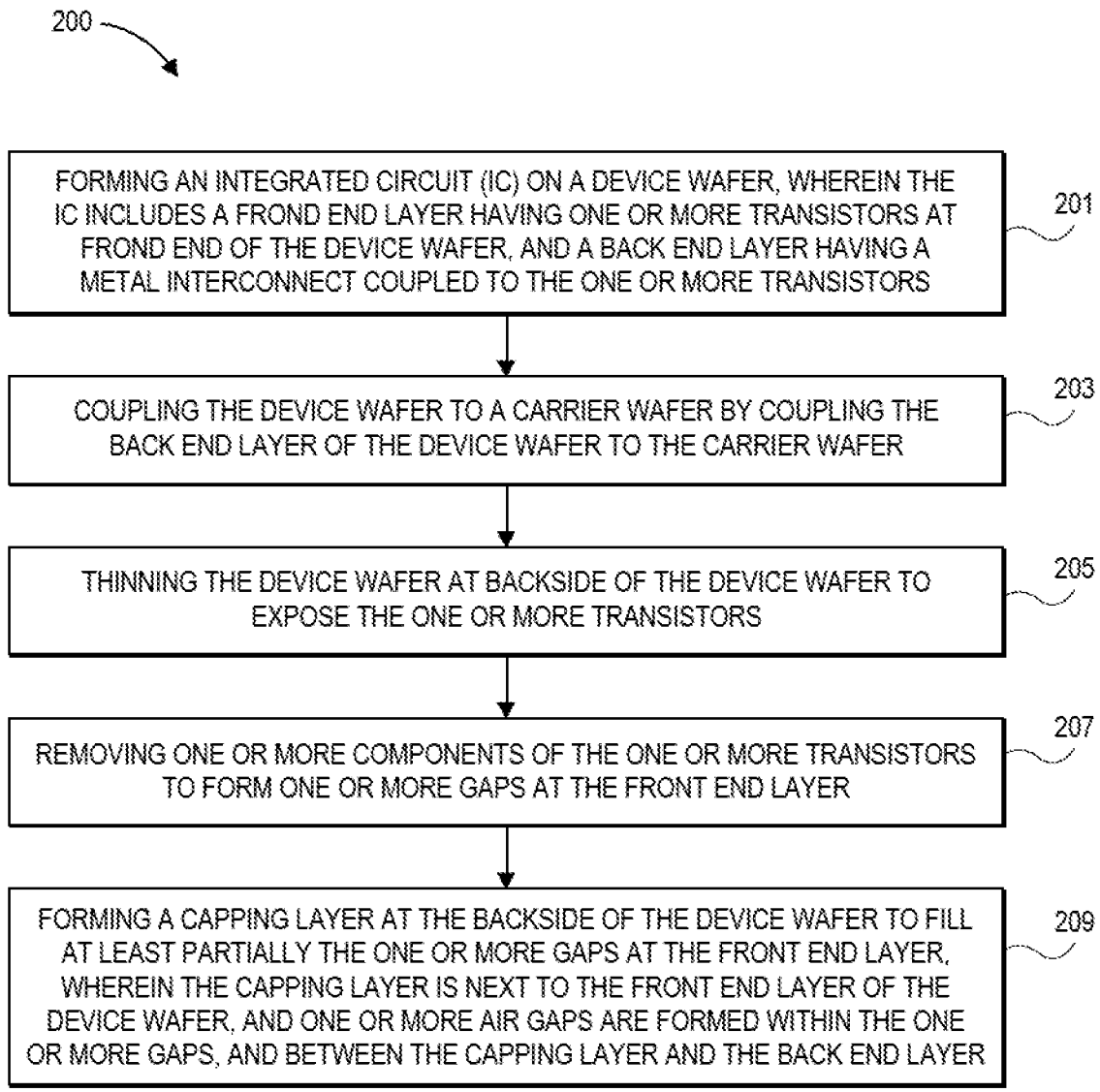
FIG. 2 schematically illustrates a process for forming air gaps in semiconductor devices including a carrier wafer and an integrated circuit formed on a device wafer bonded to the carrier wafer, in accordance with some embodiments.

FIG. 2 schematically illustrates a process 200 for forming air gaps in semiconductor devices including a carrier wafer and an integrated circuit formed on a device wafer bonded to the carrier wafer, in accordance with some embodiments. In embodiments, the process 200 may be applied to form the air gap 114 in the semiconductor device 110 including the integrated circuit 106 formed on the device wafer 103 bonded to the carrier wafer 101 in FIG. 1(a), the air gap 164 in the semiconductor device 160 including the integrated circuit 156 formed on the device wafer 153 bonded to the carrier wafer 151 in FIG. 1(b). FIGS. 3(a)-3(e), FIGS. 4(a)-4(e), FIGS. 5(a)-5(e), schematically illustrate more details of the process 200 for forming air gaps in semiconductor devices including an integrated circuit formed on a device wafer bonded to a carrier wafer.

At block 201, the process 200 may include forming an IC on a device wafer, wherein the IC includes a front end layer having one or more transistors at front end of the device wafer, and a back end layer having a metal interconnect coupled to the one or more transistors. For example, as shown in FIG. 1(a), the process 200 may include forming the IC 106 on the device wafer 103. The IC 106 includes the front end layer 105 having the transistor 120 at front end, and the back end layer 107 having a metal interconnect.

Figure 3A:
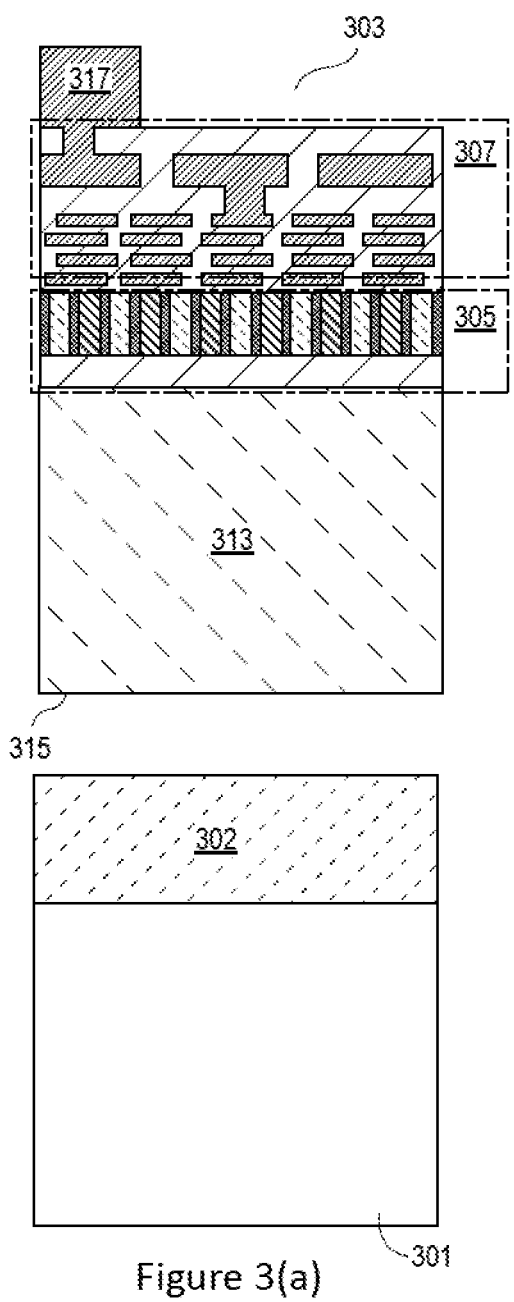
FIGS. 3(a)-3(e) schematically illustrate a process for forming air gaps in semiconductor devices including a carrier wafer and an integrated circuit formed on a device wafer bonded to the carrier wafer, in accordance with some embodiments.

In embodiments, as shown in FIG. 3(a), the process 200 may include forming an IC on a device wafer 303. The device wafer 303 includes a substrate 313. The IC is formed on the substrate 313, and includes a front end layer 305 having one or more transistors at front end of the device wafer 303, and a back end layer 307 having a metal interconnect coupled to the one or more transistors. The front end layer 305 may include a dielectric layer between the substrate 313 and the one or more transistors. Both the front end layer 305 and the back end layer 307 are formed at the front side of the substrate 313 and the front side of the device wafer 303. In addition, the IC may include a power wire or bump 317 formed further on top of the back end layer 307. The device wafer 303 has a backside 315, which is also the backside of the substrate 313 opposite to the front side of the substrate 313.

In embodiments, as shown in FIG. 4(a), the process 200 may include forming an IC on a device wafer 403. The device wafer 403 includes a substrate 413. The IC is formed on the substrate 413, and includes a front end layer 405 having one or more transistors at front end of the device wafer 403, and a back end layer 407 having a metal interconnect coupled to the one or more transistors. The front end layer 405 may include a dielectric layer between the substrate 413 and the one or more transistors. Both the front end layer 405 and the back end layer 407 are formed at the front side of the substrate 413 and the front side of the device wafer 403. The device wafer 403 has a backside 415, which is also the backside of the substrate 413 opposite to the front side of the substrate 413.

Figure 5B:
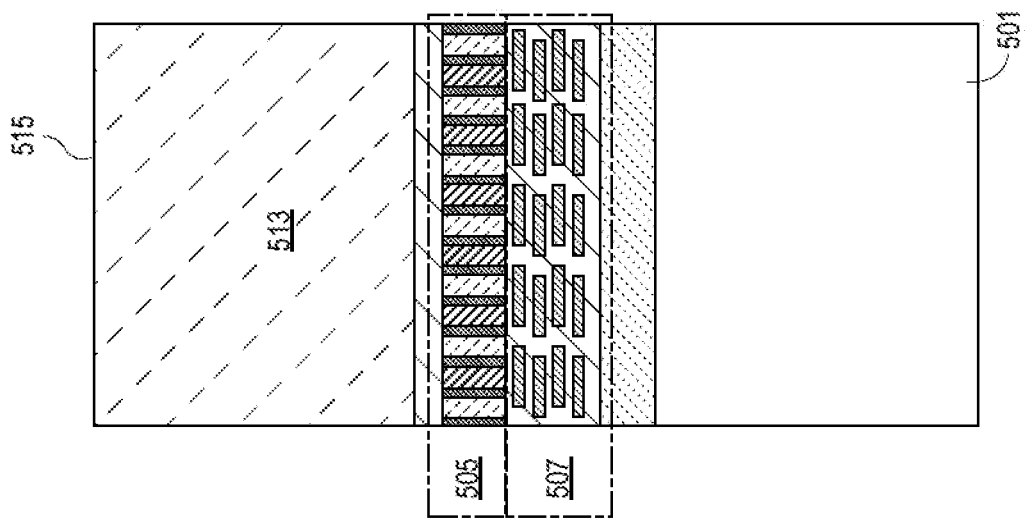
Figure 5A:
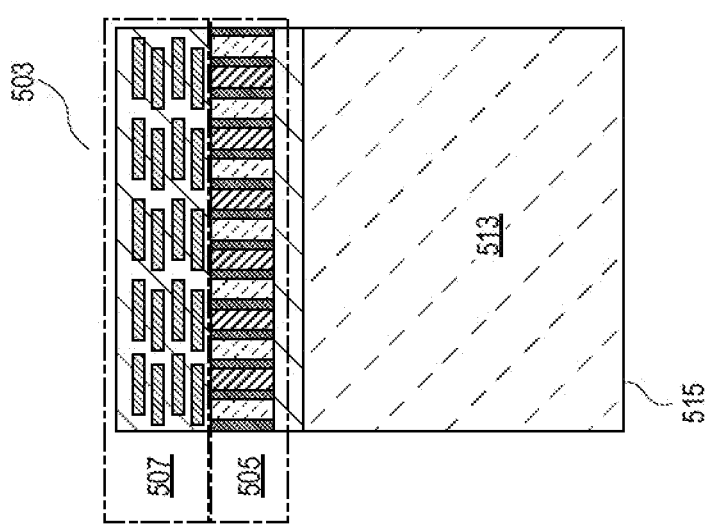

In embodiments, as shown in FIG. 5(a), the process 200 may include forming an IC on a device wafer 503. The device wafer 503 includes a substrate 513. The IC is formed on the substrate 513, and includes a front end layer 505 having one or more transistors at front end of the device wafer 503, and a back end layer 507 having a metal interconnect coupled to the one or more transistors. The front end layer 505 may include a dielectric layer between the substrate 513 and the one or more transistors. Both the front end layer 505 and the back end layer 507 are formed at the front side of the substrate 513 and the front side of the device wafer 503. The device wafer 503 has a backside 515, which is also the backside of the substrate 513 opposite to the front side of the substrate 513.

At block 203, the process 200 may include coupling the device wafer to a carrier wafer by coupling the back end layer of the device wafer to the carrier wafer.

Figure 3B:
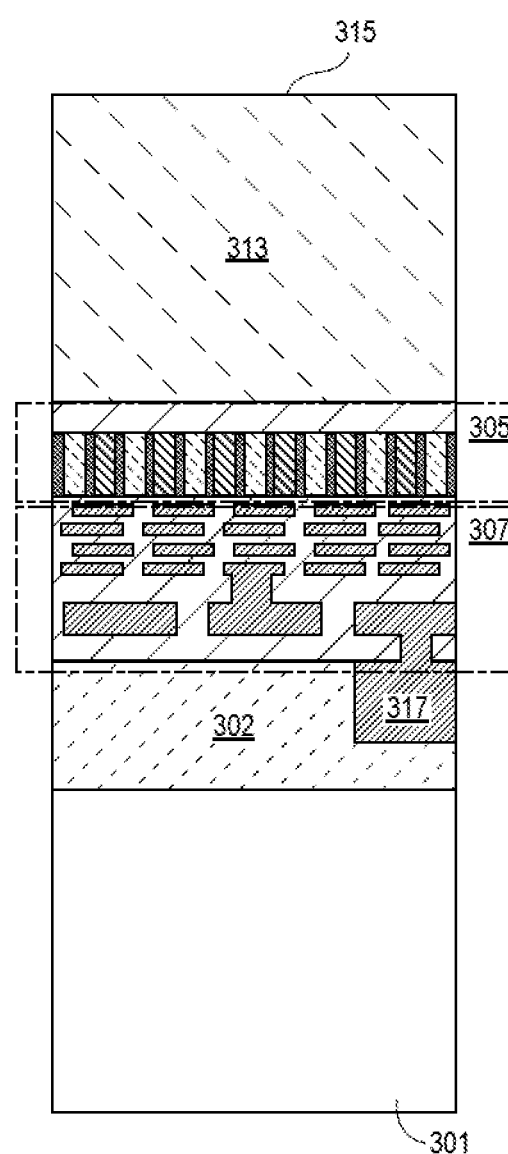

In embodiments, as shown in FIG. 3(b), the process 200 may include coupling the device wafer 303 to a carrier wafer 301 by coupling the back end layer 307 of the device wafer 303 to the carrier wafer 301. The device wafer 303 may be flipped upside down so that the back end layer 307 is coupled to the carrier wafer 301. The device wafer 303 may be bonded temporarily to the carrier wafer 301 by a glue layer 302. The glue layer 302 may include adhesive materials for temporary bonding. The power wire or bump 317 may be embedded in the glue layer 302.

In embodiments, as shown in FIG. 4(b), the process 200 may include coupling the device wafer 403 to a carrier wafer 401 by coupling the back end layer 407 of the device wafer 403 to the carrier wafer 401. The device wafer 403 may be flipped upside down so that the back end layer 407 is coupled to the carrier wafer 401. The device wafer 403 may be bonded temporarily to the carrier wafer 401 by a glue layer 402. The glue layer 402 may include adhesive materials for temporary bonding.

In embodiments, as shown in FIG. 5(b), the process 200 may include coupling the device wafer 503 to a carrier wafer 501 by coupling the back end layer 507 of the device wafer 503 to the carrier wafer 501. The device wafer 503 may be flipped upside down so that the back end layer 507 is coupled to the carrier wafer 501. The device wafer 503 may be bonded permanently to the carrier wafer 501.

At block 205, the process 200 may include thinning the device wafer at backside of the device wafer to expose the one or more transistors.

Figure 3E:
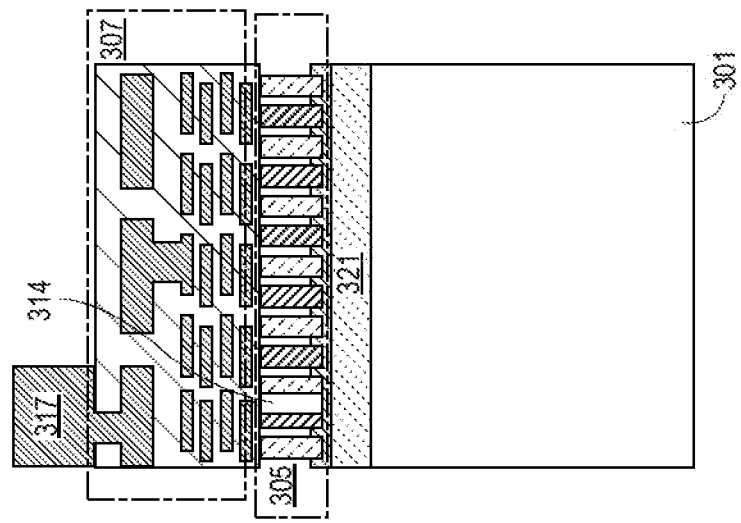
Figure 3D:
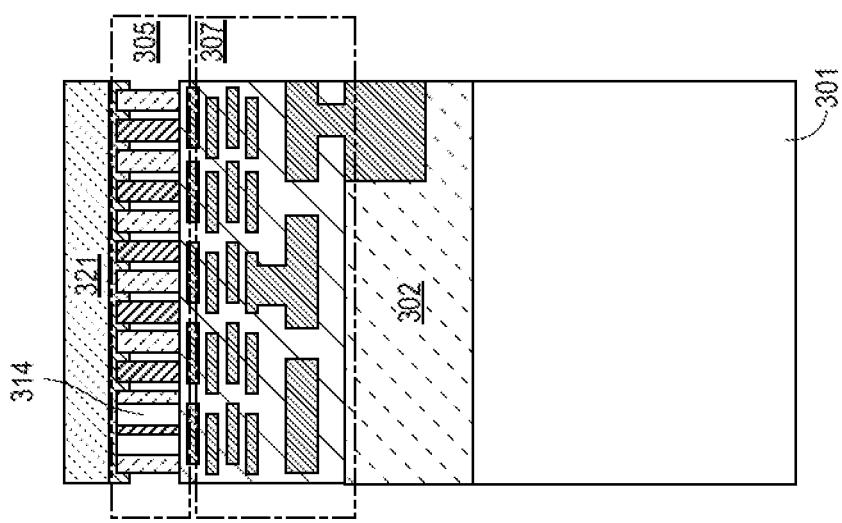
Figure 3C:
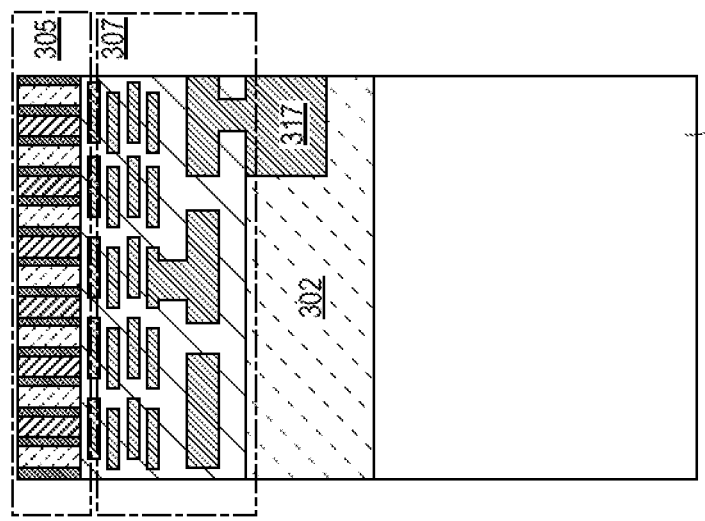

In embodiments, as shown in FIG. 3(c), the process 200 may include thinning the device wafer 303 at the backside 315 of the device wafer 303 to expose the one or more transistors at the front end layer 305. As a result, the substrate 313 below the one or more transistors may be removed. In some embodiments, a dielectric layer between the transistors and the substrate may be exposed first, and selective etching may be performed on the dielectric layer to expose the one or more transistors.

In embodiments, as shown in FIG. 4(c), the process 200 may include thinning the device wafer 403 at the backside 415 of the device wafer 403 to expose the one or more transistors at the front end layer 405. As a result, the substrate 413 below the one or more transistors may be removed. In some embodiments, a dielectric layer between the transistors and the substrate may be exposed first, and selective etching may be performed on the dielectric layer to expose the one or more transistors.

In embodiments, as shown in FIG. 5(c), the process 200 may include thinning the device wafer 503 at the backside 515 of the device wafer 503 to expose the one or more transistors at the front end layer 505. As a result, the substrate 513 below the one or more transistors may be removed. In some embodiments, a dielectric layer between the transistors and the substrate may be exposed first, and selective etching may be performed on the dielectric layer to expose the one or more transistors.

At block 207, the process 200 may include removing one or more components of the one or more transistors to form one or more gaps at the front end layer. At block 209, the process 200 may include forming a capping layer at the backside of the device wafer to fill at least partially the one or more gaps at the front end layer. The capping layer is next to the front end layer of the device wafer, and one or more air gaps are formed within the one or more gaps, and between the capping layer and the back end layer.

In embodiments, as shown in FIG. 3(d), the process 200 may include removing one or more components of the one or more transistors at the front end layer 305 to form one or more gaps at the front end layer 305. Afterwards, the process 200 may include forming a capping layer 321 at the backside to fill at least partially the one or more gaps at the front end layer 305. The capping layer 321 is next to the front end layer 305, and one or more air gaps, e.g., an air gap 314, are formed within the one or more gaps, and between the capping layer 321 and the back end layer 307.

Figure 4E:
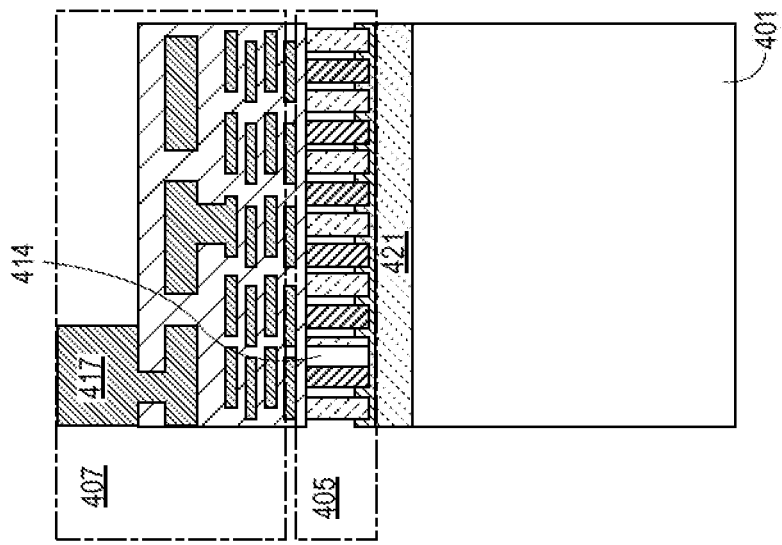
Figure 4D:
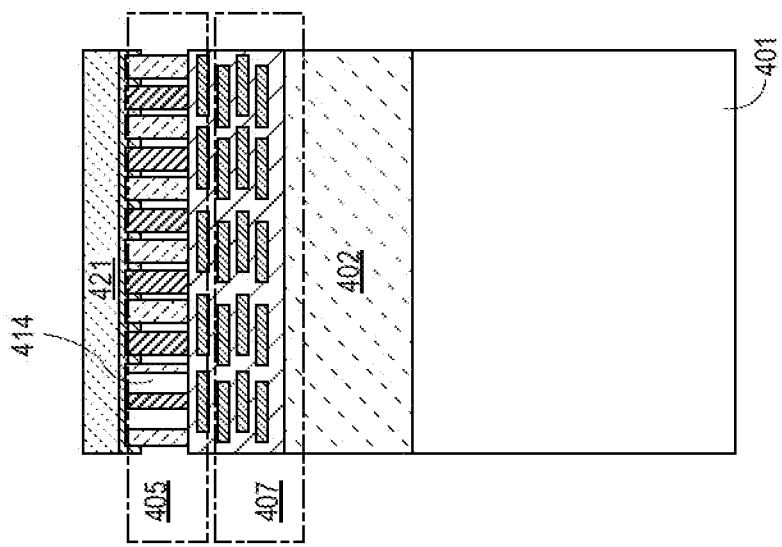

In embodiments, as shown in FIG. 4(d), the process 200 may include removing one or more components of the one or more transistors at the front end layer 405 to form one or more gaps at the front end layer 405. Afterwards, the process 200 may include forming a capping layer 421 at the backside to fill at least partially the one or more gaps at the front end layer 405. The capping layer 421 is next to the front end layer 405, and one or more air gaps, e.g., an air gap 414, are formed within the one or more gaps, and between the capping layer 421 and the back end layer 407.

In embodiments, as shown in FIG. 5(d), the process 200 may include removing one or more components of the one or more transistors at the front end layer 505 to form one or more gaps at the front end layer 505. Afterwards, the process 200 may include forming a capping layer 521 at the backside to fill at least partially the one or more gaps at the front end layer 505. The capping layer 521 is next to the front end layer 505, and one or more air gaps, e.g., an air gap 514, are formed within the one or more gaps, and between the capping layer 521 and the back end layer 507.

In addition, the process 200 may include further operations. For example, as shown in FIG. 3(e), the process 200 may include removing the glue layer 302 between the carrier wafer 301 and the back end layer 307 of the device wafer 303, and permanently bonding the capping layer 321 with the carrier wafer 301.

As shown in FIG. 4(e), the process 200 may include removing the glue layer 402 between the carrier wafer 401 and the back end layer 407 of the device wafer 403, and permanently bonding the capping layer 421 with the carrier wafer 401. Furthermore, the process 200 may also include forming power wires or bumps, e.g., a bump 417, coupled to the metal interconnect of the back end layer 407.

As shown in FIG. 5(e), the process 200 may include forming a second metal interconnect within the capping layer 521 at the backside of the device wafer 503. The process 200 may further include forming power wires or bumps, e.g., a bump 517, coupled to the metal interconnect of capping layer 521.

Figure 6:
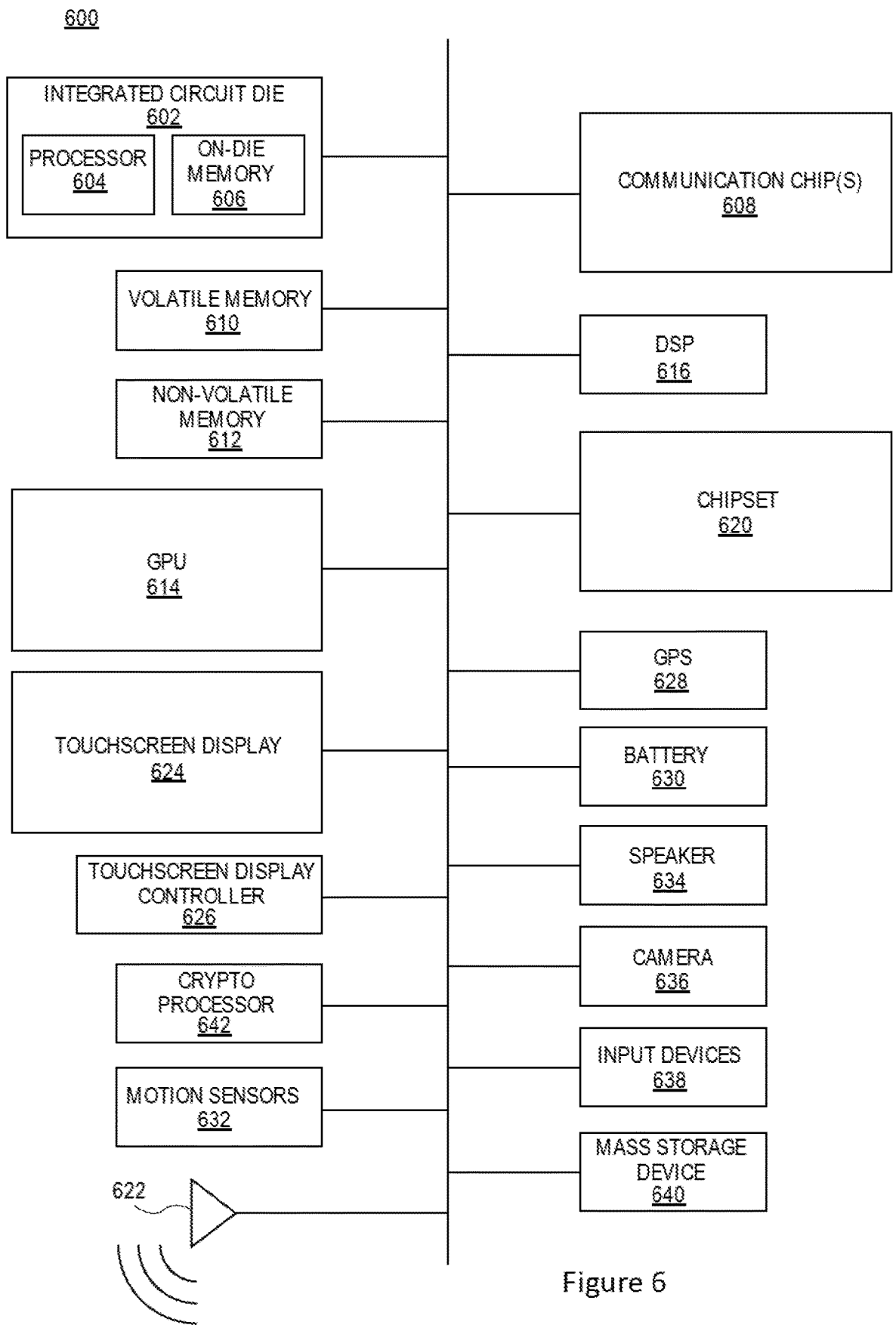
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. In embodiments, the processor 604 or the on-die memory 606 may be formed on the device wafer 103 as shown in FIG. 1(a), the device wafer 153 as shown in FIG. 1(b), the device wafer 303 as shown in FIG. 3(a), the device wafer 403 as shown in FIG. 4(a), the device wafer 503 as shown in FIG. 5(a).

In embodiments, the computing device 600 may include a display or a touchscreen display 624, and a touchscreen display controller 626. A display or the touchscreen display 624 may include a FPD, an AMOLED display, a TFT LCD, a micro light-emitting diode (μLED) display, or others.

The computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 may include a semiconductor device, comprising: a carrier wafer; and an integrated circuit (IC) formed on a device wafer and bonded to the carrier wafer, wherein the IC includes: a front end layer having one or more transistors at front end of the device wafer, and one or more gaps formed by removing components of the one or more transistors; a back end layer having a metal interconnect coupled to the one or more transistors; a capping layer at backside of the device wafer, filling at least partially the one or more gaps of the front end layer, wherein the capping layer is next to the front end layer of the device wafer; and one or more air gaps formed within the one or more gaps, and between the capping layer and the back end layer, wherein the one or more air gaps are to reduce parasitic capacitance of the IC compared to the IC without the one or more air gaps.

Example 2 may include the semiconductor device of example 1, wherein the IC further includes power wires or bumps coupled to the metal interconnect.

Example 3 may include the semiconductor device of examples 1-2, wherein the capping layer is bonded to the carrier wafer.

Example 4 may include the semiconductor device of examples 1-2, wherein the back end layer is bonded to the carrier wafer, the metal interconnect is a first metal interconnect, and the IC further includes a second metal interconnect within the capping layer at the backside of the device wafer.

Example 5 may include the semiconductor device of examples 1-4, wherein the device wafer is bonded to the carrier wafer by direct bonding, surface activated bonding, adhesive bonding, reactive bonding, glass frit bonding, or hybrid bonding.

Example 6 may include the semiconductor device of examples 1-5, wherein the one or more air gaps include an air gap within a gap between a source electrode and a gate electrode of a transistor formed by removing at least a part of a spacer between the source electrode and the gate electrode.

Example 7 may include the semiconductor device of example 6, wherein the transistor further includes a partial spacer between the source electrode and the gate electrode.

Example 8 may include the semiconductor device of example 6, wherein the gap between the source electrode and the gate electrode has a width in a range of about 1 nm to about 2 nm.

Example 9 may include the semiconductor device of examples 1-8, wherein the one or more air gaps include an air gap within a gap formed by removing at least a part of a subfin dielectric layer around a fin of a transistor, an isolation wall of the front end layer between the one or more transistors, or a part of an inter-layer dielectric layer of the metal interconnect.

Example 10 may include the semiconductor device of examples 1-8, wherein the IC further includes a low-k dielectric material within the one or more gaps formed by removing components of the one or more transistors, and the low-k dielectric material has a dielectric constant in a range of about 1 to about 3.

Example 11 may include the semiconductor device of examples 1-10, wherein the capping layer includes a low-k dielectric material with a dielectric constant in a range of about 1 to about 3.

Example 12 may include the semiconductor device of examples 1-11, wherein the carrier wafer includes a glass wafer, a sapphire wafer, a polymer wafer, or a silicon wafer.

Example 13 may include the semiconductor device of examples 1-12, wherein the one or more transistors includes a nanowire transistor, a nanotube transistor, a nanoribbon transistor, a FinFET transistor, a tri-gate FinFET transistor, a multiple-gate field-effect transistor (MuGFET) transistor, or a gate-all-around FET transistor.

Example 14 may include the semiconductor device of examples 1-13, wherein the metal interconnect includes metal contacts in multiple metal layers, and vias coupling two metal contacts together.

Example 15 may include a method for forming a semiconductor device, the method comprising: forming an integrated circuit (IC) on a device wafer, wherein the IC includes a front end layer having one or more transistors at front end of the device wafer, and a back end layer having a metal interconnect coupled to the one or more transistors; coupling the device wafer to a carrier wafer by coupling the back end layer of the device wafer to the carrier wafer; thinning the device wafer at backside of the device wafer to expose the one or more transistors; removing one or more components of the one or more transistors to form one or more gaps at the front end layer; and forming a capping layer at the backside of the device wafer to fill at least partially the one or more gaps at the front end layer, wherein the capping layer is next to the front end layer of the device wafer, and one or more air gaps are formed within the one or more gaps, and between the capping layer and the back end layer.

Example 16 may include the method of example 15, wherein the coupling the device wafer to the carrier wafer including temporarily bonding the device wafer to the carrier wafer by a glue layer, and the method further includes: removing the glue layer between the carrier wafer and the back end layer of the device wafer; and permanently bonding the capping layer with the carrier wafer.

Example 17 may include the method of example 15, wherein the coupling the device wafer to the carrier wafer including permanently bonding the back end layer of the device wafer to the carrier wafer, the metal interconnect is a first metal interconnect, and the method further includes: forming a second metal interconnect within the capping layer at the backside of the device wafer.

Example 18 may include the method of examples 15-17, further comprising: forming power wires or bumps coupled to the metal interconnect of the back end layer.

Example 19 may include the method of examples 15-18, wherein the one or more air gaps include an air gap within a gap between a source electrode and a gate electrode of a transistor formed by removing a spacer between the source electrode and the gate electrode.

Example 20 may include the method of examples 15-19, wherein the one or more air gaps include an air gap within a gap formed by removing at least a part of a subfin dielectric layer around a fin of a transistor, an isolation wall of the front end layer between the one or more transistors, or a part of an inter-layer dielectric layer of the metal interconnect.

Example 21 may include the method of examples 15-20, further comprising: forming a low-k dielectric material within the one or more gaps formed by removing the one or more components of the one or more transistors, and the low-k dielectric material has a dielectric constant in a range of about 1 to about 3.

Example 22 may include a computing device, comprising: a print circuit board (PCB); and a semiconductor device coupled to the PCB, wherein the semiconductor device includes: a carrier wafer; and an integrated circuit (IC) formed on a device wafer and bonded to the carrier wafer, wherein the IC includes: a front end layer having one or more transistors at front end of the device wafer, and one or more gaps formed by removing components of the one or more transistors; a back end layer having a metal interconnect coupled to the one or more transistors; a capping layer at backside of the device wafer, filling at least partially the one or more gaps of the front end layer, wherein the capping layer is next to the front end layer of the device wafer; and one or more air gaps formed within the one or more gaps, and between the capping layer and the metal interconnect, wherein the one or more air gaps are to reduce parasitic capacitance of the IC compared to the IC without the one or more air gaps.

Example 23 may include the computing device of example 22, wherein the one or more air gaps include an air gap within a gap formed by removing at least a part of a subfin dielectric layer around a fin of a transistor, an isolation wall of the front end layer between the one or more transistors, or a part of an inter-layer dielectric layer of the metal interconnect.

Example 24 may include the computing device of examples 22-23, wherein the IC further includes a low-k dielectric material within the one or more gaps formed by removing components of the one or more transistors, and the low-k dielectric material has a dielectric constant in a range of about 1 to about 3.

Example 25 may include the computing device of examples 22-24, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific IC implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
    a carrier wafer; and
    an integrated circuit (IC) on a device wafer and bonded to the carrier wafer, wherein the IC includes:
        a first layer having one or more transistors at a front side of the device wafer, and one or more gaps, wherein each of the one or more transistors comprises a channel structure;
        a second layer having a metal interconnect coupled to the one or more transistors;
        a capping layer at a backside of the device wafer, filling at least partially the one or more gaps of the first layer, wherein the capping layer is next to the first layer of the device wafer, and wherein the capping layer is in contact with a bottom surface of the channel structure of each of the one or more transistors; and
        one or more air gaps formed within the one or more gaps, and between the capping layer and the second layer.

2. The semiconductor device of claim 1, wherein the IC further includes power wires or bumps coupled to the metal interconnect.

3. The semiconductor device of claim 1, wherein the capping layer is bonded to the carrier wafer.

4. The semiconductor device of claim 1, wherein the second layer is bonded to the carrier wafer, the metal interconnect is a first metal interconnect, and the IC further includes a second metal interconnect within the capping layer at the backside of the device wafer.

5. The semiconductor device of claim 1, wherein the device wafer is bonded to the carrier wafer by direct bonding, surface activated bonding, adhesive bonding, reactive bonding, glass frit bonding, or hybrid bonding.

6. The semiconductor device of claim 1, wherein the one or more air gaps include an air gap within a gap between a source electrode and a gate electrode of a transistor formed by removing at least a part of a spacer between the source electrode and the gate electrode.

7. The semiconductor device of claim 6, wherein the transistor further includes a partial spacer between the source electrode and the gate electrode.

8. The semiconductor device of claim 6, wherein the gap between the source electrode and the gate electrode has a width in a range of about 1 nm to about 2 nm.

9. The semiconductor device of claim 1, wherein the one or more air gaps include an air gap within a gap formed by removing at least a part of a subfin dielectric layer around a fin of a transistor, an isolation wall of the first layer between the one or more transistors, or a part of an inter-layer dielectric layer of the metal interconnect.

10. The semiconductor device of claim 1, wherein the IC further includes a low-k dielectric material within the one or more gaps formed by removing components of the one or more transistors, and the low-k dielectric material has a dielectric constant in a range of about 1 to about 3.

11. The semiconductor device of claim 1, wherein the capping layer includes a low-k dielectric material with a dielectric constant in a range of about 1 to about 3.

12. The semiconductor device of claim 1, wherein the carrier wafer includes a glass wafer, a sapphire wafer, a polymer wafer, or a silicon wafer.

13. The semiconductor device of claim 1, wherein the one or more transistors includes a nanowire transistor, a nanotube transistor, a nanoribbon transistor, a FinFET transistor, a tri-gate FinFET transistor, a multiple-gate field-effect transistor (MuGFET) transistor, or a gate-all-around FET transistor.

14. The semiconductor device of claim 1, wherein the metal interconnect includes metal contacts in multiple metal layers, and vias coupling two metal contacts together.

15. A method for forming a semiconductor device, the method comprising:
    forming an integrated circuit (IC) on a device wafer, wherein the IC includes a first layer having one or more transistors at front side of the device wafer, and a second layer having a metal interconnect coupled to the one or more transistors;
    coupling the device wafer to a carrier wafer by coupling the second layer of the device wafer to the carrier wafer;
    thinning the device wafer at backside of the device wafer to expose the one or more transistors;
    removing one or more components of the one or more transistors to form one or more gaps at the first layer; and
    forming a capping layer at the backside of the device wafer to fill at least partially the one or more gaps at the first layer, wherein the capping layer is next to the first layer of the device wafer, and wherein the capping layer is in contact with a bottom surface of a channel structure of each of the one or more transistors, and one or more air gaps are formed within the one or more gaps, and between the capping layer and the second layer.

16. The method of claim 15, wherein the coupling the device wafer to the carrier wafer including temporarily bonding the device wafer to the carrier wafer by a glue layer, and the method further includes:
    removing the glue layer between the carrier wafer and the second layer of the device wafer; and
    permanently bonding the capping layer with the carrier wafer.

17. The method of claim 15, wherein the coupling the device wafer to the carrier wafer including permanently bonding the second layer of the device wafer to the carrier wafer, the metal interconnect is a first metal interconnect, and the method further includes:

forming a second metal interconnect within the capping layer at the backside of the device wafer.

18. The method of claim 15, further comprising:
forming power wires or bumps coupled to the metal interconnect of the second layer.

19. The method of claim 15, wherein the one or more air gaps include an air gap within a gap between a source electrode and a gate electrode of a transistor formed by removing a spacer between the source electrode and the gate electrode.

20. The method of claim 15, wherein the one or more air gaps include an air gap within a gap formed by removing at least a part of a subfin dielectric layer around a fin of a transistor, an isolation wall of the first layer between the one or more transistors, or a part of an inter-layer dielectric layer of the metal interconnect.

21. The method of claim 15, further comprising:
forming a low-k dielectric material within the one or more gaps formed by removing the one or more components of the one or more transistors, and the low-k dielectric material has a dielectric constant in a range of about 1 to about 3.

22. A computing device, comprising:
a print circuit board (PCB); and
a semiconductor device coupled to the PCB, wherein the semiconductor device includes:
a carrier wafer; and
an integrated circuit (IC) on a device wafer and bonded to the carrier wafer, wherein the IC includes:
a first layer having one or more transistors at a front side of the device wafer, and one or more gaps, wherein each of the one or more transistors comprises a channel structure;
a second layer having a metal interconnect coupled to the one or more transistors;
a capping layer at a backside of the device wafer, filling at least partially the one or more gaps of the first layer, wherein the capping layer is next to the first layer of the device wafer, and wherein the capping layer is in contact with a bottom surface of the channel structure of each of the one or more transistors; and
one or more air gaps formed within the one or more gaps, and between the capping layer and the metal interconnect.

23. The computing device of claim 22, wherein the one or more air gaps include an air gap within a gap formed by removing at least a part of a subfin dielectric layer around a fin of a transistor, an isolation wall of the first layer between the one or more transistors, or a part of an inter-layer dielectric layer of the metal interconnect.

24. The computing device of claim 22, wherein the IC further includes a low-k dielectric material within the one or more gaps formed by removing components of the one or more transistors, and the low-k dielectric material has a dielectric constant in a range of about 1 to about 3.

25. The computing device of claim 22, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

26. A semiconductor device, comprising:
a carrier wafer; and
an integrated circuit (IC) on a device wafer and bonded to the carrier wafer, wherein the IC includes:
a first layer having one or more transistors at a front side of the device wafer, and one or more gaps formed by removing components of the one or more transistors;
a second layer having a metal interconnect coupled to the one or more transistors;
a capping layer at a backside of the device wafer, filling at least partially the one or more gaps of the first layer, wherein the capping layer is next to the first layer of the device wafer, and wherein the capping layer is in contact with a bottom surface of a channel structure of each of the one or more transistors, wherein the second layer is bonded to the carrier wafer, the metal interconnect is a first metal interconnect, and the IC further includes a second metal interconnect within the capping layer at the backside of the device wafer; and
one or more air gaps formed within the one or more gaps, and between the capping layer and the second layer, wherein the one or more air gaps are to reduce parasitic capacitance of the IC compared to the IC without the one or more air gaps.

* * * * *